(12) United States Patent
Braun et al.

(10) Patent No.: US 12,050,254 B2
(45) Date of Patent: Jul. 30, 2024

(54) APPARATUS FOR QUALITY CONTROL OF A SUPERCONDUCTING TAPE

(71) Applicant: Commonwealth Fusion Systems LLC, Devens, MA (US)

(72) Inventors: Thomas Braun, Rheinbach (DE); Ruslan Karabalaev, Rheinbach (DE); Michael Baecker, Rheinbach (DE); Roger Woerdenweber, Jülich (DE)

(73) Assignee: Commonwealth Fusion Systems LLC, Devens, MA (US)

( * ) Notice: Subject to any disclaimer, the term of this patent is extended or adjusted under 35 U.S.C. 154(b) by 922 days.

(21) Appl. No.: 17/047,111

(22) PCT Filed: Apr. 17, 2019

(86) PCT No.: PCT/EP2019/059893
§ 371 (c)(1),
(2) Date: Oct. 13, 2020

(87) PCT Pub. No.: WO2019/206758
PCT Pub. Date: Oct. 31, 2019

(65) Prior Publication Data
US 2021/0208217 A1 Jul. 8, 2021

(30) Foreign Application Priority Data
Apr. 25, 2018 (EP) .................................... 18169282

(51) Int. Cl.
*G01R 33/12* (2006.01)
*G01R 33/00* (2006.01)

(52) U.S. Cl.
CPC ....... *G01R 33/1238* (2013.01); *G01R 33/007* (2013.01)

(58) Field of Classification Search
CPC .......................... G01R 33/1238; G01R 33/007
See application file for complete search history.

(56) References Cited

U.S. PATENT DOCUMENTS

| 5,936,394 A * | 8/1999 | Kaneko | G01R 33/1246 |
| | | | 324/71.6 |
| 2006/0073977 A1* | 4/2006 | Xie | G01R 33/1246 |
| | | | 505/300 |

(Continued)

FOREIGN PATENT DOCUMENTS

| EP | 0860705 A2 | 8/1998 |
| EP | 1198846 A2 | 4/2002 |

(Continued)

OTHER PUBLICATIONS

International Search Report and Written Opinion for corresponding PCT/EP2019/059893, mailed Jul. 4, 2019, 11 Pages.

(Continued)

*Primary Examiner* — Paul A Wartalowicz
(74) *Attorney, Agent, or Firm* — Wolf, Greenfield & Sacks, P.C.

(57) ABSTRACT

Described herein is an apparatus for quality control of a superconducting tape including
(a) at least two rolls contacting the superconducting tape and being suitable for injecting an electric current into the superconducting tape;
(b) at least two measuring contacts contacting the superconducting tape and being suitable for measuring an electric voltage along the superconducting tape; and
(c) a cooling section suitable for cooling the superconducting tape below its critical temperature,
where the at least two rolls and the at least two measuring contacts are located inside the cooling section, and
where the cooling section is suitable for keeping the rolls at a first temperature and the measuring contacts at a second temperature, where the first temperature is lower than the second temperature.

14 Claims, 1 Drawing Sheet

(56) References Cited

U.S. PATENT DOCUMENTS

| | | | |
|---|---|---|---|
| 2008/0084207 A1* | 4/2008 | Frantz | G01R 33/1238 |
| | | | 324/307 |
| 2009/0088326 A1 | 4/2009 | Baecker | |
| 2010/0059145 A1 | 3/2010 | Hattendorf et al. | |
| 2011/0140710 A1 | 6/2011 | Ha et al. | |
| 2012/0249171 A1 | 10/2012 | Baecker et al. | |
| 2016/0141080 A1 | 5/2016 | Otto et al. | |

FOREIGN PATENT DOCUMENTS

| | | |
|---|---|---|
| EP | 1208244 B1 | 5/2004 |
| EP | 0830218 B1 | 5/2006 |
| EP | 1972931 A1 | 9/2008 |
| EP | 2137330 A2 | 12/2009 |
| JP | H09166566 A | 6/1997 |
| KR | 20160056853 A | 5/2016 |
| WO | 2008000485 A1 | 1/2008 |
| WO | 2011029669 A1 | 3/2011 |

OTHER PUBLICATIONS

European Search Report for EP Patent Application No. 18169282.3, Issued on Nov. 9, 2018, 3 pages.

* cited by examiner

APPARATUS FOR QUALITY CONTROL OF A SUPERCONDUCTING TAPE

CROSS-REFERENCE TO RELATED APPLICATIONS

This application is a U.S. National Phase Application of International Patent Application No. PCT/EP2019/059893, filed Apr. 17, 2019, which claims the benefit of priority to European Patent Application No. 18169282.3, filed Apr. 25, 2018, the entire contents of which are hereby incorporated by reference herein.

The present invention is in the field of apparatuses for quality control of a superconducting tape.

Superconducting tapes can be used in various applications, for example in cables or false current limiters. For most applications, very long tapes are required, in the order of several hundred meters or even a few kilometers. Any defect in the tape may lead to a malfunction of the whole tape. Defect typically means that the critical current $I_c$ at a certain position is lower than required by the specification. Therefore, it is important to have an apparatus for quality control available, which can very efficiently locate any defect on a long tape such that this defect can be fixed, for example by cutting it out and soldering the ends together or by bridging it. Generally, such apparatuses are known in the prior art.

WO 2011/029 669 A1 discloses an apparatus for the quality control of a tape by injecting an electric current into the tape at low temperatures and measuring the voltage drop along the tape. However, this setup is limited in terms of the measurement speed and the current which can be injected into the tape due to heat generation at contacts, which is required to simulate the actual usage of the tape in the application.

It was therefore an object of the present invention to provide an apparatus for quality control of a superconducting tape, which allows high speed measurements while injecting high electric currents into the tape to be measured. The apparatus was also targeted to exert low mechanical forces on the tape and provide high flexibility and a low likelihood of producing measurement artifacts.

These objects were achieved by an apparatus for quality control of a superconducting tape comprising
  (a) at least two rolls contacting the superconducting tape and being suitable for injecting an electric current into the superconducting tape and
  (b) at least two measuring contacts contacting the superconducting tape and being suitable for measuring an electric voltage along the superconducting tape and
  (c) a cooling section suitable for cooling the superconducting tape below its critical temperature,
wherein the at least two rolls and the at least two measuring contacts are located inside the cooling section and
wherein the cooling section is suitable for keeping the rolls at a first temperature and the measuring contacts at a second temperature, wherein the first temperature is lower than the second temperature.

The present invention further relates to a process for quality control of a superconducting tape comprising injecting an electric current at a first temperature below the critical temperature of the superconducting tape and measuring a voltage along the superconducting tape at a second temperature below the critical temperature of the superconducting tape, wherein the second temperature is higher than the first temperature.

Preferred embodiments of the present invention can be found in the description and the claims. Combinations of different embodiments fall within the scope of the present invention.

The superconducting tape according to the present invention typically comprises a substrate, a buffer layer, a superconducting layer, a noble metal layer, and a stabilizer layer. However, superconducting tapes with other architectures can in most cases also be measured with the apparatus according to the present invention.

The substrate may be formed of any material capable of supporting buffer and/or superconducting layers. For example, suitable substrates are disclosed in EP 830 218, EP 1 208 244, EP 1 198 846, and EP 2 137 330. Often, the substrate is a metal and/or alloy strip/tape, whereby the metal may be or the alloy may contain nickel, silver, copper, zinc, aluminum, iron, chromium, vanadium, palladium, molybdenum, tungsten. Preferably the substrate is nickel based, which means that at least 50 at-% of the substrate is nickel, more preferably at least 70 at-%, in particular at least 85 at-%. Sometimes, some of these alloys are referred to by the trade name Hastelloy®. More preferably, the substrate is nickel based and contains 1 to 10 at-%, in particular 3 to 9 at-%, tungsten. Laminated metal tapes, tapes coated with a second metal like galvanic coating or any other multi-material tape with a suitable surface can also be used as substrate.

The substrate can be non-textured, partially textured or textured, preferably it is textured. In case the substrate is partially textured, preferably its surface is textured. The substrates are typically 20 to 200 µm thick, preferably 30 to 100 µm. The length is typically 1 to 1000 m, for example 100 m, the width is typically 0.4 cm to 1 m. The ratio of length to width is typically at least 100, preferably at least 200, in particular at least 500.

Preferably, the surface of the substrate has a roughness with rms according to DIN EN ISO 4287 and 4288 of less than 15 nm. The roughness refers to an area of 10×10 µm within the boundaries of a crystallite grain of the substrate surface, so that the grain boundaries of the metal substrate do not influence the specified roughness measurement.

The buffer layer can contain any material capable of supporting the superconductor layer. Examples of buffer layer materials include metals and metal oxides, such as silver, nickel, TbOx, GaOx, CeO2, yttria-stabilized zirconia (YSZ), $Y_2O_3$, $LaAlO_3$, $SrTiO_3$, $Gd_2O_3$, $LaNiO_3$, $LaCuO_3$, $SrRuO_3$, $NdGaO_3$, $NdAlO_3$ and/or some nitrides as known to those skilled in the art. Preferred buffer layer materials are yttrium-stabilized zirconium oxide (YSZ); various zirconates, such as gadolinium zirconate, lanthanum zirconate; titanates, such as strontium titanate; and simple oxides, such as cerium oxide, or magnesium oxide. More preferably the buffer layer contains lanthanum zirconate, cerium oxide, yttrium oxide, strontium titanate and/or rare-earth-metal-doped cerium oxide such as gadolinium-doped cerium oxide. Even more preferably the buffer layer contains lanthanum zirconate and/or cerium oxide. Preferably, the superconductor tape comprises multiple buffer layers each containing a different buffer material are between the substrate and the film. Preferably the superconductor tape includes two or three buffer layers, for example a first buffer layer comprising lanthanum zirconate and a second buffer layer containing cerium oxide. The buffer layer is preferably textured, more preferably the buffer layer has a cubic texture.

To enhance the degree of texture transfer and/or the efficiency as diffusion barrier, the superconducting tape preferably contains more than one buffer layer on top of each other. Preferably the superconducting tape comprises two or three buffer layers, for example a first buffer layer comprising lanthanum zirconate and a second buffer layer containing cerium oxide.

The buffer layer preferably covers the whole surface of the substrate on one side, which means at least 95% of the surface, more preferably at least 99% of the surface. The buffer layer typically has a thickness of 5 to 500 nm, for example 10 to 30 nm or 150 to 300 nm.

Preferably, the superconductor layer contains a compound of the formula $RE_xBa_yCu_3O_{7-\delta}$. RE stands for a rare earth metal, preferably yttrium, dysprosium, holmium, erbium, gadolinium, europium, samarium, neodymium, praseodymium, or lanthanum, in particular yttrium. The index x assumes a value of 0.9 to 1.8, preferably 1.2 to 1.5. The index y assumes a value of 1.4 to 2.2, preferably 1.5 to 1.9. The index $\delta$ assumes a value of 0.1 to 1.0, preferably 0.3 to 0.7. The superconductor layer preferably has a thickness of 200 nm to 2 µm, more preferably 400 nm to 1.5 µm. Preferably, the superconductor layer has crystal grains with a high degree of orientation to each other.

The superconducting layer preferably has a low surface roughness, for example an rms according to DIN EN ISO 4287 and 4288 of less than 100 nm or even less than 50 nm. The superconducting layer typically has a resistance close to zero at low temperatures, preferably up to a temperature of at least 77 K. Preferably, the superconductor layer has a critical current density without externally applied magnetic field of at least $1 \cdot 10^6$ A/cm$^2$ at 77 K, more preferably at least $1.5 \cdot 10^6$ A/cm$^2$ at 77 K. Preferably, the critical current density decreases by less than 30% if a magnetic field of 0.1 T is applied perpendicular to the surface of the superconductor layer, more preferably it decreases by less than 20%. Preferably, the critical current density decreases by less than 15% if a magnetic field of 0.1 T is applied parallel to the surface of the superconductor layer, more preferably it decreases by less than 10%.

The noble metal layer avoids the degradation of the superconductor layer when the stabilizer layer is deposited. It also increases the conductivity of the tape for the deposition of the stabilizer layer, which is particularly relevant if electrodeposition is used. Typically, the noble metal comprising layer contains silver. A method of making a noble metal comprising layer on a superconducting layer is disclosed for example in WO 2008/000 485 A1.

The stabilizer layer typically has a low electrical resistance, preferably lower than 1 µΩm at room temperature, more preferably lower than 0.2 µΩm at room temperature, in particular lower than 0.05 µΩm at room temperature. Often, the stabilizer layer comprises a metal, preferably copper, silver, tin, zinc or an alloy containing one of these, in particular copper. Preferably, the stabilizer layer contains at least 50 at-% copper, tin or zinc, more preferably at least 70 at-%, in particular at least 85 at-%.

The stabilizer layer often covers the whole circumference of the tape, i.e. it overlies the superconducting layer, the substrate and at least two of the side surfaces. Preferably, the superconducting tape comprises two stabilizer layers, wherein the first stabilizer layer covers the whole circumference of the tape and the second stabilizer layer is made by one or two metal tapes which are soldered onto the first stabilizer layer. If two metal tapes are used, they are preferably soldered to opposite sides of the superconducting tape.

Metal in the context of the present invention refers to any material which contains at least one metal element and has metallic electrical conductivity, i.e. at least $10^5$ S/m at room temperature. The metal tape can contain various metals, preferably copper, nickel, chromium, zinc, aluminum, magnesium, tin, or alloys thereof, for example brass, bronze, or stainless steel. It is possible that the metal tape has a homogeneous composition or it has a layered structure of different metal compositions. Gradients in the composition are also conceivable. The metal tape preferably has a thickness of 10 to 1000 µm, more preferably 20 to 500 µm, in particular 50 to 300 µm.

The complete stabilizer layer typically has a thickness of 5 to 1000 µm, preferably 10 to 500, in particular 20 to 300 µm, for example 50 or 100 µm. It is possible that the stabilizer layer has a different thickness on the different sides of the tape or the same. If the thickness is different, the thickness ranges above refer to the side with the highest thickness. In particular if the stabilizer layer is a galvanized layer, the so called "dog-bone" effect often leads to higher thicknesses at the edges compared to flat areas.

The superconducting tape preferably has a length of 10 m to 10 km, more preferably 100 m to 1 km. Preferably, the superconducting tape has a width of 1 mm to 10 cm, more preferably 2 to 20 mm, in particular 4 mm to 12 mm. Preferably the superconducting tape has a thickness of 60 to 800 µm, more preferably 100 to 500 µm, in particular 150 to 400 µm.

The superconducting tape is moved through the apparatus according to the present invention. This can for example be achieved by a supply spool and a receiver spool. The superconducting tape is unwound from the supply spool, moves through the apparatus and is then wound onto the receiver spool. Furthermore, the apparatus is typically capable of rotating the supply and/or the receiver spool to unwind and re-wind the superconducting tape. The speed of rotation of the supply and/or the receiver spool typically adjusts the speed by which the superconducting tape is moved in the apparatus. Typical speeds are 0.1 to 1000 m/h, preferably 1 to 500 m/h, more preferably 10 to 300 m/h, in particular 50 to 200 m/h. Preferably, the rotation of the spools can be reversed, so the superconducting tape moves in the opposite direction through the apparatus.

The apparatus according to the present invention comprises at least two rolls contacting the superconducting tape and being suitable for injecting an electric current into the superconducting tape. For an efficient current injection, the contact area between the roll and the superconducting tape is preferably large. This can be achieved by a large wind angle of the superconducting tape around each roll and/or a large roll diameter. Preferably, the wind angle of the superconducting tape around each roll is independently between 120° and 240°, more preferably 140° to 220°, in particular 160° to 200°, for example 180°. The diameter of the roll is preferably at least 20 cm, more preferably at least 25 cm, for example at least 30 cm. For practical reasons, the diameter is usually not more than 100 cm. The rolls can have the same diameter or different diameters, preferably they have the same. Preferably, the apparatus contains at least four rolls contacting the superconducting tape. If four rolls are used, preferably two rolls are on the same first electric potential and contact the superconducting tape from opposite sides and two other rolls are on the same second electric potential and contact the superconducting tape from opposite sides. This typically enhances the current injection efficiency into the tape, i.e. decreases the losses due to the contact resistance and ensures an equal distribution of the current over the superconducting tape.

The rolls have to be electrically conductive, at least at their surface where they contact the superconducting tape. Preferably, the rolls are made of a metal with a specific conductivity of at least 1 S/m at 20° C., more preferably a metal with a specific conductivity of at least 2 S/m at 20° C., in particular a metal with a specific conductivity of at least 4 S/m at 20° C. Preferably, the rolls are made of copper.

In principle, the superconducting tape can slip over the rolls. However, this often exerts too high sheer forces onto the superconducting tape. Therefore, the rolls preferably turn as the superconducting tape is moved through the apparatus such that no relative motion between the superconducting tape and the surface of the rolls at the place of contact occurs.

For mechanically delicate superconducting tapes, the sheer forces with the rolls are still too high due to the friction caused by the sliding contact typically used to inject the current into the turning roll. It is therefore preferred that the at least two rolls each have an axle which is partially outside the cooling section and is electrically contacted outside the cooling section by a sliding contact. In this case, the axle needs to be electrically conductive, either by making it from a metal or by placing a cable in its inside which electrically connects the roll with the part of the axle which is in contact with the sliding contact. This arrangement makes it possible to attach a drive motor to the axle outside the cooling section which compensates the friction loss of the sliding contact and thus reduces the sheer forces onto the superconducting tape. In addition, if the sliding contact is placed in a part which is at room temperature, the current can be injected efficiently and the contact resistance does not heat up the cooling section. Preferably, the axle is mounted outside the cooling section which further reduces friction and thus heat generation inside the cooling section.

Preferably, the rolls are arranged horizontally such that the axles are arranged vertically. In this way, the axle can extend at the top to outside the cooling section. This avoids the need for sophisticated seals against cryogenic agent loss.

According to the present invention, the rolls inject electric current into the superconducting tape. Preferably, the electric current is 100 A to 1000 A. Preferably, the electric current is varied over time, for example as a sinus current or a saw tooth current. The minimum to maximum difference in current typically depends on the geometry and the quality of the superconducting tape, preferably it is 0.01 to 1.5 times the critical current, more preferably 0.05 to 1 times the critical current, in particular 0.1 to 0.5 times the critical current. For example, the minimum to maximum difference in current can be 1 A to 1000 A, more preferably 10 A to 300 A, in particular 50 A to 150 A. Preferably, the frequency of the current variation is 0.01 Hz to 1 Hz, more preferably 0.05 Hz to 0.5 Hz, in particular 0.1 Hz, to 0.3 Hz.

The apparatus according to the present invention comprises at least two measuring contacts contacting the superconducting tape and being suitable for measuring an electric voltage along the superconducting tape. The measuring contact can be sliding contacts or roll contacts, preferably roll contacts. More preferably, the measuring contact comprises a pair of roll contact, so the superconducting tape can be contacted on both sides. Preferably, the apparatus contains at least three measuring contacts, more preferably, the apparatus contains at least four measuring contacts, in particular the apparatus contains at least six measuring contacts. Preferably, the number of measuring contacts can be varied, i.e. measuring contacts can be added or removed individually. If the apparatus contains more than two measuring contacts, the distance between each two adjacent measuring contacts can be the same or different to each other, preferably the position of the measuring contacts can be changed and thus the distance between each two adjacent measuring contacts can be varied. The distance between each two adjacent measuring contacts is preferably 1 cm to 100 cm, more preferably 5 cm to 50 cm, in particular 10 cm to 35 cm. If the apparatus comprises at least four measurement contacts, two of them are preferably located in the cooling section where the temperature is the temperature at which the rolls for current injection are kept. The advantage of such an arrangement is that the complete voltage drop in the superconducting tape in the cooling section with the higher temperature can be monitored to reduce the risk of quenching which can cause damage to the superconducting tape as well as to the apparatus.

A simple way of determining the critical current is to adjust the injected current such that the electric field between two measuring contacts assumes a predefined value. In the context of the present invention the critical current causes an electric field along the superconducting tape of 1 μV/cm.

Preferably, the apparatus comprises a controller suitable for controlling the electric current injected into the superconducting tape based upon the voltage measured between the measurement contacts. The controller typically receives the voltages measured between pairs of measuring contacts and stores these values together with a position information, i.e. where the voltage was measured on the tape. The position information can be obtained, for example, based on the speed of the tape at any given time. Therefore, the controller is preferably adapted for receiving speed information from the supply and/or receiver spool or from a speed gauge. Preferably, the controller is adapted to obtain the information, where on the tape a certain voltage is measured. If the electric current which flows through the superconducting tape is varied over time and the apparatus comprises more than two measuring contacts, different pairs of measuring contacts can measure the voltage at different currents for every position of the superconducting tape. This is because a piece of the superconducting tape which is measured between two measurement contacts moves to the next pair of measurement contacts and during this time the current through the superconducting tape increases or decreases due to its variation.

The controller can collect all measured voltages and their associated currents and calculate an I-V curve, for example by fitting the known relationship $U/U_c \sim (I/I_c)^n$, wherein U is the voltage, $U_c$ is the voltage at the critical current, I the current, $I_c$ the critical current and n a material constant. From this curve, the controller can determine the critical current $I_c$, namely the current at the characteristic voltage described above, as well as the material constant n. If the voltages measured between the measuring contacts are far from this value, the controller can either increase or decrease the electric current which is injected into the superconducting tape. This avoids any damage to the superconducting tape at positions where the critical current is lower than expected, for example due to a defect. Also, this adjustment increases the accuracy of the measured critical current.

Preferably, the controller is adapted for causing a reversal of the moving direction of the superconducting tape, for example by controlling the supply and receiver spool. In this way, the measurement can be repeated if at a certain position a critical current is below a set value. Repeating the measurement can reduce the likelihood of producing measuring artifacts.

Preferably, the apparatus further comprises means for applying a magnetic field to the superconducting tape in between two measurement contacts, preferably perpendicular to the superconducting tape. The magnetic field strength can be between 0.01 T to 10 T, preferably 0.05 T to 1 T. The magnetic field strength can constant or variable over time. If it is variable over time, the dependence of the critical current on the magnetic field can be determined. Preferably, the magnetic field is controlled by the controller. Preferably, the means for applying a magnetic field are located in between two measurement contacts.

The apparatus according to the present invention further comprises a cooling section suitable for cooling the superconducting tape below its critical temperature. The cooling section typically comprises a cryostat comprising an insulated vessel, for example a vacuum flask or a Dewar, filled with a cryogenic agent, such as liquid helium or liquid nitrogen, preferably liquid nitrogen. The critical temperature of a superconducting tape is as commonly used the temperature at which the electric resistance of the superconducting tape drops, i.e. the superconducting tape becomes superconductive.

According to the present invention the at least two rolls and the at least two measuring contacts are located inside the cooling section, wherein the cooling section is suitable for keeping the rolls at a first temperature and the measuring contacts at a second temperature, wherein the first temperature is lower than the second temperature. One way of realizing two different temperatures in the cooling section is to place a cooler in proximity to the rolls and a heater in proximity to the measuring contacts. Generally, the critical current of superconductors increases with decreasing temperature. Keeping the current injection at a lower temperature than the measurement contacts thus enables measuring close to the critical current while injecting the current well below the critical current. This reduces the risk of damaging the superconducting tape as a result of local heating over the critical temperature causing a breakdown of superconductivity. At the same time the different temperatures allow the injection of high currents at high moving speeds of the superconducting tape. Preferably, the first temperature is at least 1 K lower than the second temperature, more preferably, the first temperature is at least 2 K lower than the second temperature, even more preferably, the first temperature is at least 3 K lower than the second temperature, in particular the first temperature is at least 4 K lower than the second temperature. For example, the first temperature is 73 K and the second temperature is 77 K, i.e. close to the boiling point of liquid nitrogen of 77.15 K at atmospheric pressure where high temperature superconductors are typically operated.

Preferably, the apparatus comprises a precooling section for the superconducting tape just before it enters the cooling section. Such a precooling section can, for example, be a conduit of a rectangular cross-section, which is placed around the superconducting tape and stands in contact to the cryogenic agent at one end. Such a conduit is made of a material with high thermal conductivity, preferably copper. The precooling section makes it possible to further increase the speed at which the superconducting tape can be moved through the apparatus.

Preferably, the apparatus is symmetric such that the superconducting tape can be moved in both directions in the same way. Typically, this means that the apparatus is symmetric with regard to a vertical plane at the center of the apparatus. The plane is also vertical to the general moving direction of the superconducting tape from the supply spool to the receiver spool. In this way, the moving direction of the superconducting tape through the apparatus can be reversed without changing the temperature profile and the profile of sheer forces the superconducting tape experiences on its way through the apparatus.

DETAILED DESCRIPTION

Figure 1:
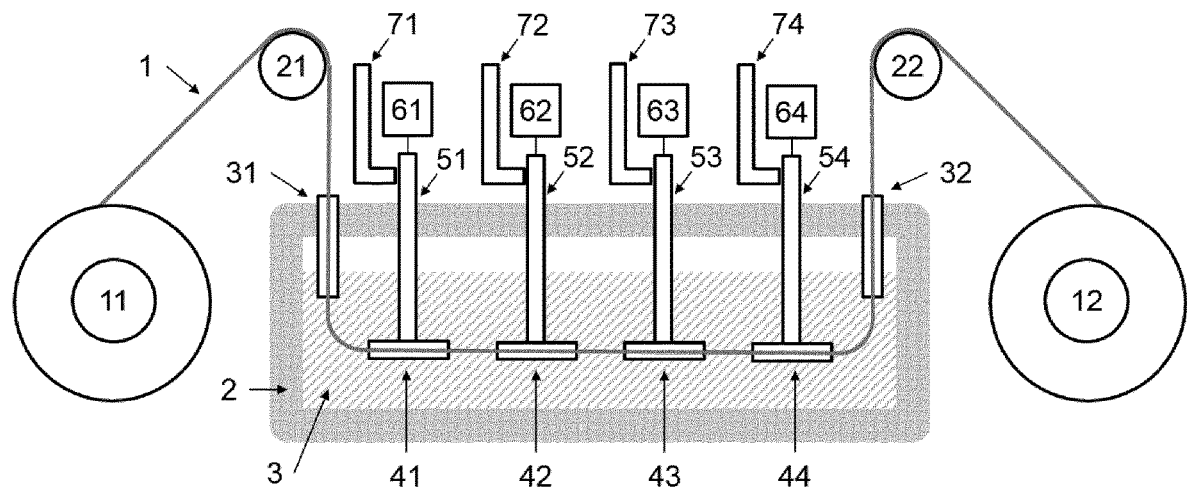
FIG. 1 shows a front view of an apparatus.
Figure 2:
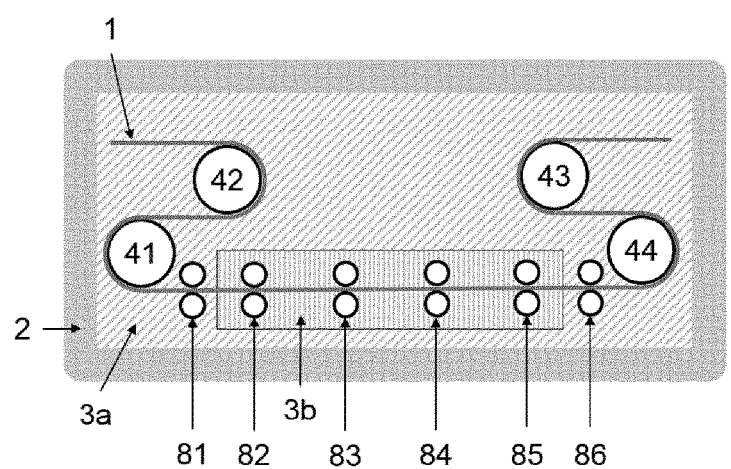
FIG. 2 shows a top view of the apparatus.

A preferred example of an apparatus according to the present invention is shown in FIGS. 1 and 2. FIG. 1 shows a front view while FIG. 2 shows a top view of this apparatus. The superconducting tape (1) is unwound from the supply spool (11) and rewound onto the receiver spool (12). The deflector rolls (21, 22) let the superconducting tape (1) enter and exit the cooling section (2) which is filled with a cryogenic agent (3) from the top. The precooling section (31, 32) precool the superconducting tape (1) on its way into the cooling section (2). The rolls for injecting current (41, 42, 43, 44) are placed within the cooling section where the cryogenic agent is at a lower temperature (3a). The rolls are connected to axles (51, 52, 53, 54) which are mechanically connected to drive motors (61, 62, 63, 64) and electrically connected to slide contacts (71, 72, 73, 74). The measurement contacts (81, 82, 83, 84, 85, 86) are pairs of roll contacts. Two of them (81, 86) are placed in the cooling section where the cryogenic agent is at a lower temperature (3a), so they can monitor the voltage drop along the whole part of the superconductor tape which is in the section where the cryogenic agent has a higher temperature (3b). The remaining measurement contacts (82, 83, 84, 85) are placed in the cooling section where the cryogenic agent is at higher temperature (3b).

The process according to the present invention preferably employs the apparatus according to the present invention. Therefore, all details and preferred embodiments described for the apparatus apply mutatis mutandis to the process.

The invention claimed is:

1. An apparatus for quality control of a superconducting tape comprising
    (a) at least two rolls contacting the superconducting tape and being suitable for injecting an electric current into the superconducting tape;
    (b) at least two measuring contacts contacting the superconducting tape and being suitable for measuring an electric voltage along the superconducting tape; and
    (c) a cooling section suitable for cooling the superconducting tape below its critical temperature,
wherein the at least two rolls and the at least two measuring contacts are located inside the cooling section, and wherein the cooling section is suitable for keeping the at least two rolls at a first temperature and the at least two measuring contacts at a second temperature, wherein the first temperature is lower than the second temperature.

2. The apparatus according to claim 1, wherein the first temperature is at least 2 K lower than the second temperature.

3. The apparatus according to claim 1, wherein the at least two rolls each have an axle which is partially outside the cooling section and is electrically contacted outside the cooling section by a sliding contact.

4. The apparatus according to claim 3, wherein a drive motor is attached to the axle outside the cooling section.

5. The apparatus according to claim 1, wherein the apparatus contains at least four rolls, wherein two rolls are on the same first electric potential and contact the superconducting tape from opposite sides and two other rolls are on the same second electric potential and contact the superconducting tape from opposite sides.

6. The apparatus according to claim 1, wherein the at least two rolls are arranged horizontally.

7. The apparatus according to claim 1, wherein a wind angle of the superconducting tape around each roll is independently between 120° and 240°.

8. The apparatus according to claim 1, wherein the apparatus comprises at least four measuring contacts.

9. The apparatus according to claim 1, wherein a distance between the at least two measuring contacts is variable.

10. The apparatus according to claim 1, wherein the apparatus comprises a controller suitable for controlling the electric current injected into the superconducting tape based upon a voltage measured between the at least two measuring contacts.

11. The apparatus according to claim 1, wherein the apparatus comprises a precooling section for the superconducting tape just before it enters the cooling section.

12. The apparatus according to claim 1, wherein the apparatus is symmetric such that the superconducting tape can be moved in both directions in the same way.

13. The apparatus according to claim 1, wherein the apparatus is suitable for injecting an electric current which periodically varies over time.

14. A process for quality control of a superconducting tape, the process comprising:
   injecting an electric current at a first temperature below a critical temperature of the superconducting tape, wherein the injecting of the electric current is performed using at least two rolls contacting the superconducting tape; and
   measuring a voltage along the superconducting tape at a second temperature below the critical temperature of the superconducting tape, wherein the measuring of the voltage is performed using at least two measuring contacts contacting the superconducting tape,
   wherein the second temperature is higher than the first temperature, and
   wherein the at least two rolls and the at least two measuring contacts are located inside a cooling section.

* * * * *